United States Patent
Warren et al.

(10) Patent No.: US 8,948,310 B2
(45) Date of Patent: Feb. 3, 2015

(54) USE OF RDS DATA TO SELECT MATCHING NETWORK

(75) Inventors: Daniel Adam Warren, San Jose, CA (US); Joseph Roi Fisher, Jr., San Jose, CA (US); James Tsung-Tai Yang, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 1502 days.

(21) Appl. No.: 12/554,077

(22) Filed: Sep. 4, 2009

(65) Prior Publication Data

US 2011/0058627 A1    Mar. 10, 2011

(51) Int. Cl.
*H03K 9/00* (2006.01)
*H04L 27/00* (2006.01)
*H04B 1/18* (2006.01)
*H03H 7/38* (2006.01)
*H04B 1/04* (2006.01)

(52) U.S. Cl.
CPC . *H04B 1/18* (2013.01); *H03H 7/38* (2013.01); *H04B 1/0458* (2013.01)
USPC .......................................................... 375/316

(58) Field of Classification Search
USPC .......................................................... 375/316
See application file for complete search history.

(56) References Cited

U.S. PATENT DOCUMENTS

| | | |
|---|---|---|
| 5,778,308 A | 7/1998 | Sroka et al. |
| 6,255,906 B1 | 7/2001 | Eidson et al. |
| 7,514,900 B2 | 12/2002 | Sivan |
| 6,509,998 B2 | 1/2003 | Huang |
| 6,845,126 B2 | 1/2005 | Dent et al. |
| 7,499,679 B2 | 3/2009 | Yang |
| 7,660,557 B2 | 2/2010 | Steelberg et al. |

(Continued)

OTHER PUBLICATIONS

Wikipedia, Radio Data System, http://en.wikipedia.org/wiki/Radio_Data_System, Last Accessed Jun. 13, 2009.

(Continued)

*Primary Examiner* — Tanmay Shah
(74) *Attorney, Agent, or Firm* — Park, Vaughan, Fleming & Dowler LLP

(57) ABSTRACT

Devices and methods for dynamically selecting a matching network for an antenna are provided. In one example, an electronic device capable of selecting such a matching network may include an antenna, several selectable matching networks, a radio receiver, and matching network control circuitry. The radio receiver may couple to the antenna via one of the selectable matching networks to receive a radio signal with both an analog and digital component. The matching network control circuitry may select the matching network from among the several selectable matching networks based at least in part on a characteristic of the digital component of the radio signal.

8 Claims, 12 Drawing Sheets

(56) References Cited

U.S. PATENT DOCUMENTS

| | | |
|---|---|---|
| 2002/0003890 A1 | 1/2002 | Warren |
| 2005/0245228 A1* | 11/2005 | Candal et al. .................. 455/347 |
| 2007/0155347 A1* | 7/2007 | Heuermann et al. .......... 455/107 |
| 2007/0241985 A1* | 10/2007 | Suzuki et al. ................. 343/860 |
| 2008/0049817 A1 | 2/2008 | Der et al. |
| 2008/0051918 A1 | 2/2008 | Tuttle et al. |
| 2008/0062052 A1* | 3/2008 | Suzuki et al. ................. 343/702 |
| 2008/0084117 A1 | 4/2008 | Sander |
| 2008/0129610 A1 | 6/2008 | Tsfati et al. |
| 2009/0058687 A1 | 3/2009 | Rothkopf |
| 2009/0130992 A1 | 5/2009 | Ganwani et al. |
| 2009/0141046 A1 | 6/2009 | Rathnam |
| 2009/0179611 A1 | 7/2009 | Sander |
| 2010/0195753 A1* | 8/2010 | Yamamoto et al. ........... 375/267 |
| 2010/0283551 A1* | 11/2010 | Zeng et al. ............. 331/117 FE |

OTHER PUBLICATIONS

Dietmar Kopitz, RDS: The Radio Data System, pp. 55-72.
RDS Forum, Mar. 2009: RDS is now 25—The Complete History, Available At http://www.rds.org.uk/rds98/pdf/RDS_25_090327_4.pdf, Last Accessed Aug. 21, 2009.
NAB Broadcasters, United States RBDS Standard, Apr. 9, 1998, pp. 1-204.

* cited by examiner

USE OF RDS DATA TO SELECT MATCHING NETWORK

BACKGROUND

The present disclosure relates generally to impedance matching for an antenna and, more particularly, to selecting a matching network for an antenna based on certain signal characteristics.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

To efficiently transfer a received radio frequency (RF) signal from an antenna to a radio receiver, a matching network may be employed. Electrically coupled between the antenna and the receiver, the matching network may compensate for impedance differences between the antenna and the receiver. When the impedances of the antenna and the radio receiver are known, a single matching network may be configured for efficient RF signal transfer over a range of RF frequencies. Generally, the impedances of the antenna and the radio receiver may be known when the antenna is fixed in place and/or is located at a known physical location relative to an RF signal source.

Certain electronic devices, however, may employ antennas having variable impedances, or antenna network profiles. For example, many handheld electronic devices may use headsets or other flexible external wiring as antennas. In general, different varieties of headsets may have different antenna network profiles. Moreover, the antenna network profiles of such headsets may vary during normal use, as the headsets may move. When headset wiring changes shape by flexing, wrapping, twisting, and so forth, the antenna network profile of the headset may accordingly change, potentially causing the impedance of the headset to become unmatched to the radio receiver, which may cause a degradation of signal quality.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate generally to dynamically selecting a matching network for an antenna. In one example, an electronic device capable of selecting such a matching network may include an antenna, several selectable matching networks, a radio receiver, and matching network control circuitry. The radio receiver may couple to the antenna via one of the selectable matching networks to receive a radio signal with both an analog and digital component. The matching network control circuitry may select the matching network from among the several selectable matching networks based at least in part on a characteristic of the digital component of the radio signal.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
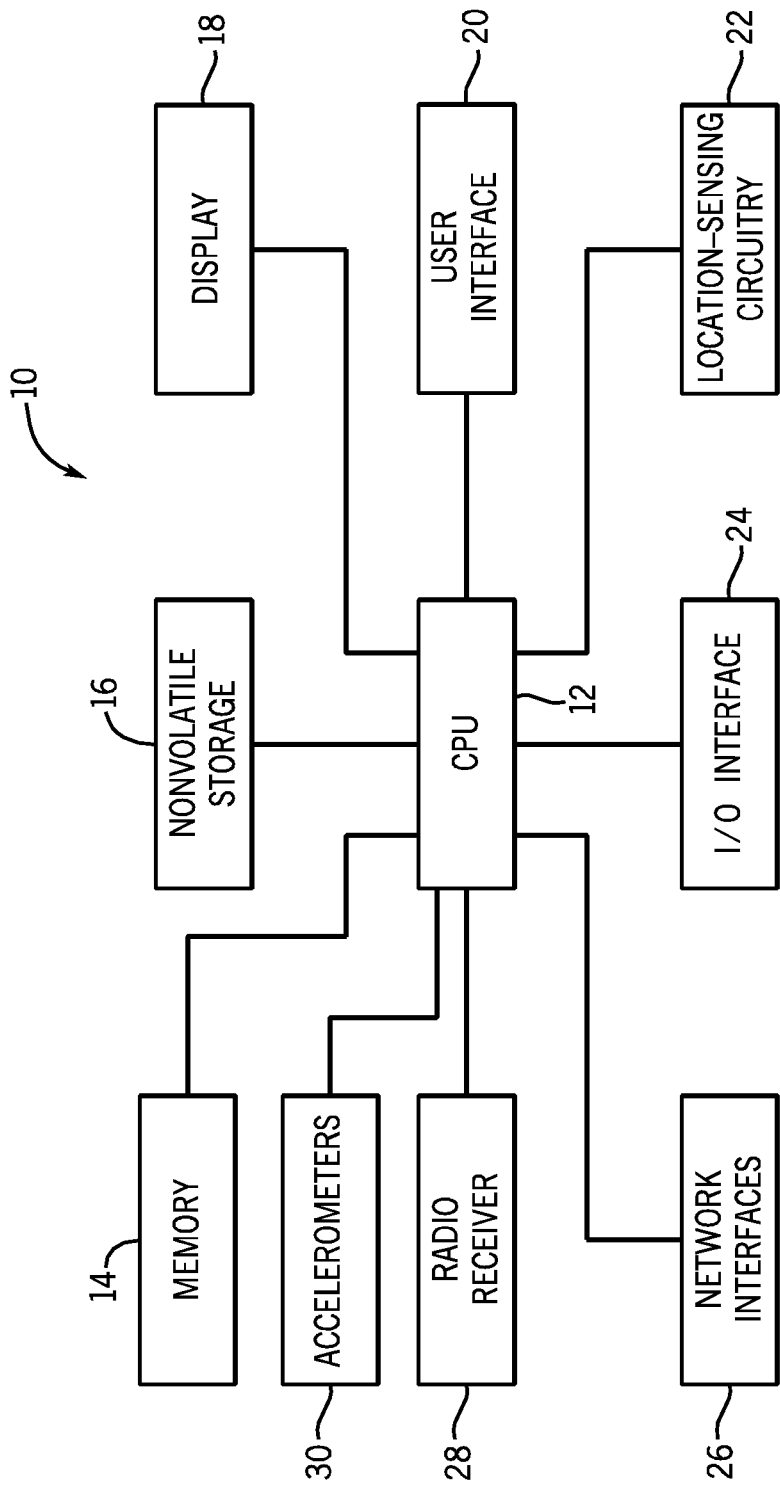
FIG. 1 is a block diagram illustrating an embodiment of an electronic device capable of performing the techniques disclosed herein.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Embodiments of the presently disclosed subject matter relate generally to systems, methods, and devices for selecting a matching network for an antenna. In particular, certain flexible antennas of conductive wiring, such as headsets for use with handheld electronic devices, may have antenna network profiles that vary as the antennas flex, wrap, twist, and so forth. Rather than employ a single matching network for such an antenna, presently disclosed embodiments of electronic devices employing such flexible antennas may select a suitable matching network from among several selectable matching networks.

Presently disclosed embodiments of electronic devices may receive radio signals that include a digital component over flexible antennas. For example, certain broadcast FM radio signals may include both an analog audio component and a supplementary digital signal in the Radio Data System or Radio Broadcast Data System (both of which are referred to herein as "RDS") format. Rather than select the matching network based solely on certain signal characteristics of the received raw radio signal or only the analog component of the received raw radio signal, presently disclosed embodiments of electronic devices may select the matching network based at least in part on signal characteristics of the digital component of the radio signal. As described below, such digital component signal characteristics may include, for example, a locking speed of the digital component, the completeness of the digital component, a block error rate (BER) of the digital component, and/or a confidence of the digital component, among other things.

With the foregoing in mind, a general description of suitable electronic devices for performing the presently disclosed techniques is provided below with reference to FIGS. 1 and 2. In particular, FIG. 1 is a block diagram depicting various components that may be present in an electronic device suitable for use with the present techniques, and FIG. 2 represents one example of a suitable electronic device, which may be, as illustrated, a handheld electronic device having an antenna, a radio receiver, and two or more selectable matching networks.

Figure 2:
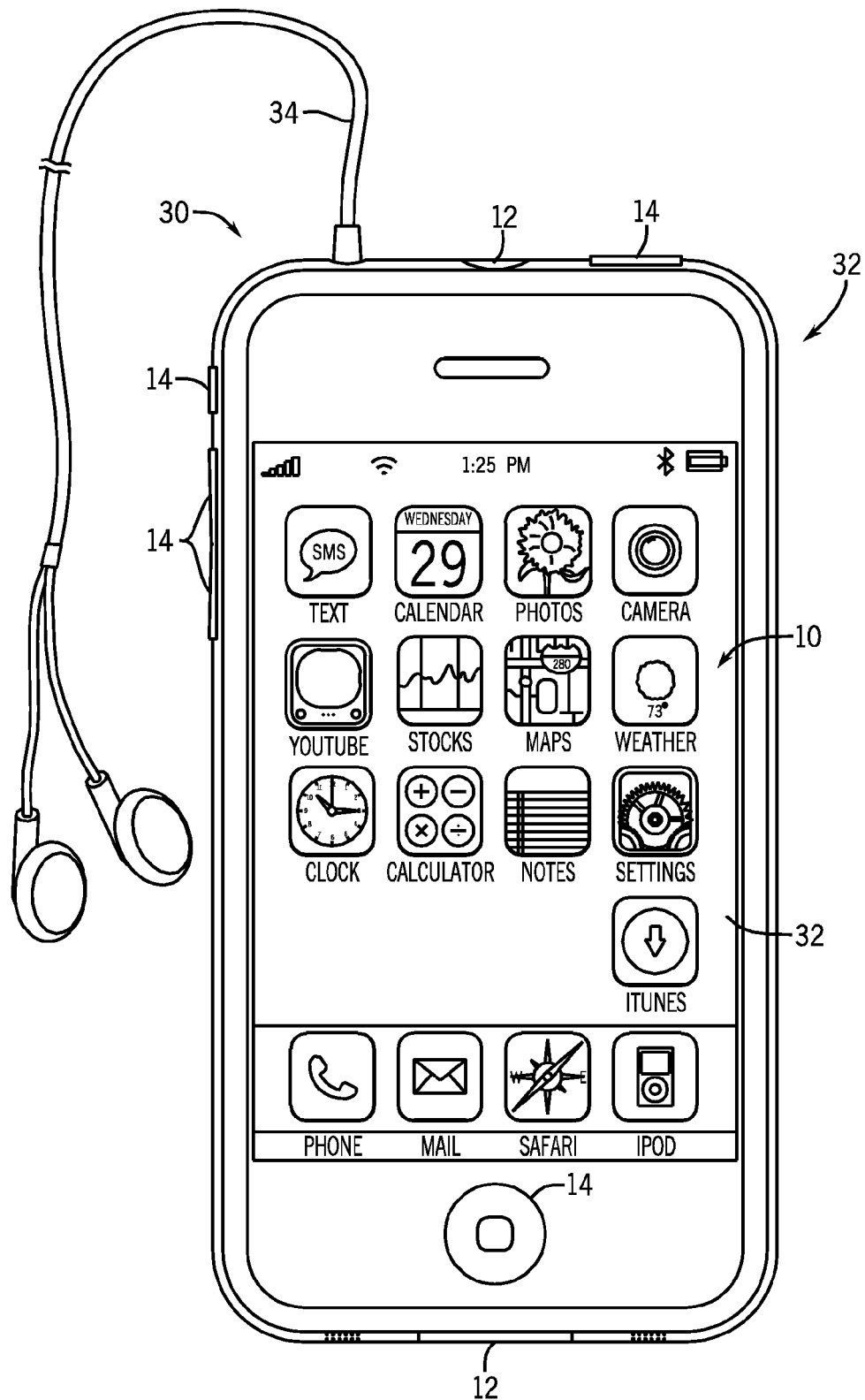
FIG. 2 is a schematic illustration of a handheld embodiment of the electronic device of FIG. 1.

Turning first to FIG. 1, electronic device 10 for performing the presently disclosed techniques may include, among other things, central processing unit (CPU) 12, main memory 14, nonvolatile storage 16, display 18, user interface 20, location-sensing circuitry 22, input/output (I/O) interface 24, network interfaces 26, radio receiver 28, and accelerometers 30. By way of example, electronic device 10 may represent a block diagram of the handheld device depicted in FIG. 2 or a similar device.

In electronic device 10 of FIG. 1, CPU 12 may be operably coupled to main memory 14 and nonvolatile memory 16 to perform various algorithms for carrying out the presently disclosed techniques. Display 18 may be a touch-screen display, which may enable users to interact with user interface 20 of electronic device 10. Location-sensing circuitry 22 may represent device capabilities for determining the relative or absolute location of electronic device 10. By way of example, location-sensing circuitry 22 may represent Global Positioning System (GPS) circuitry, algorithms for estimating location based on proximate wireless networks, such as local Wi-Fi networks, and/or magnetometer circuitry for estimating a current facial direction of electronic device 10. I/O interface 24 may enable electronic device 10 to interface with various other electronic devices, as may network interfaces 26. Network interfaces 26 may include, for example, interfaces for a personal area network (PAN), such as a Bluetooth network, for a local area network (LAN), such as an 802.11x Wi-Fi network, and/or for a wide area network (WAN), such as a 3G cellular network. Accelerometers 30 may indicate a current movement or orientation of electronic device 10.

Electronic device 10 may receive radio broadcasts using radio receiver 28. Radio receiver 28 may receive broadcasts in one or more specific bands of spectrum, such as the FM radio band, and may detect both an audio signal and a concurrently-encoded digital signal when tuned to a desired frequency. By way of example, the audio signal may be an analog or digital FM radio signal and the concurrently-encoded digital signal may be a digital signal in the Radio Data System (RDS) or Radio Broadcast Data System (RBDS) (collectively referred to herein as "RDS") format. Radio receiver 28 may receive the radio signal from an antenna, which may include the conductive wiring of a headset attached to electronic device 10. The antenna may join to radio receiver 28 via one of a number of selectable matching networks, as described in greater detail below.

FIG. 2 depicts handheld device 32, which may represent one embodiment of electronic device 10. Handheld device 32 may be, for example, a portable phone, a media player, a personal data organizer, a handheld game platform, or any combination of such devices. By way of example, handheld device 32 may be a model of an iPod® or iPhone® available from Apple Inc. of Cupertino, Calif.

Handheld device 32 may couple to antenna 34, illustrated as a headset connected to handheld device 32 via flexible conductive wiring. Enclosure 36 may protect interior components from physical damage and to shield them from electromagnetic interference. Enclosure 36 may surround display 18, which may display interface 20. I/O interfaces 24 may open through enclosure 36 and may include, for example, a proprietary I/O port from Apple Inc. to connect to external devices.

User input structures 38, 40, 42, and 44 may, in combination with display 18, allow a user to control handheld device 32. For example, input structure 38 may activate or deactivate handheld device 32, input structure 40 may navigate user interface 20 to a home screen or a user-configurable application screen, input structures 42 may provide volume control, and input structure 44 may toggle between vibrate and ring modes. Microphones 46 and speaker 48 may enable playback of audio and/or may enable certain phone capabilities. Headset input 50 may provide a connection to antenna 34 when antenna 34 is a headset. Headset input 50 may provide an electrical connection to radio receiver 28 via one of a number of selectable matching networks, as described in greater detail below.

Figure 3:
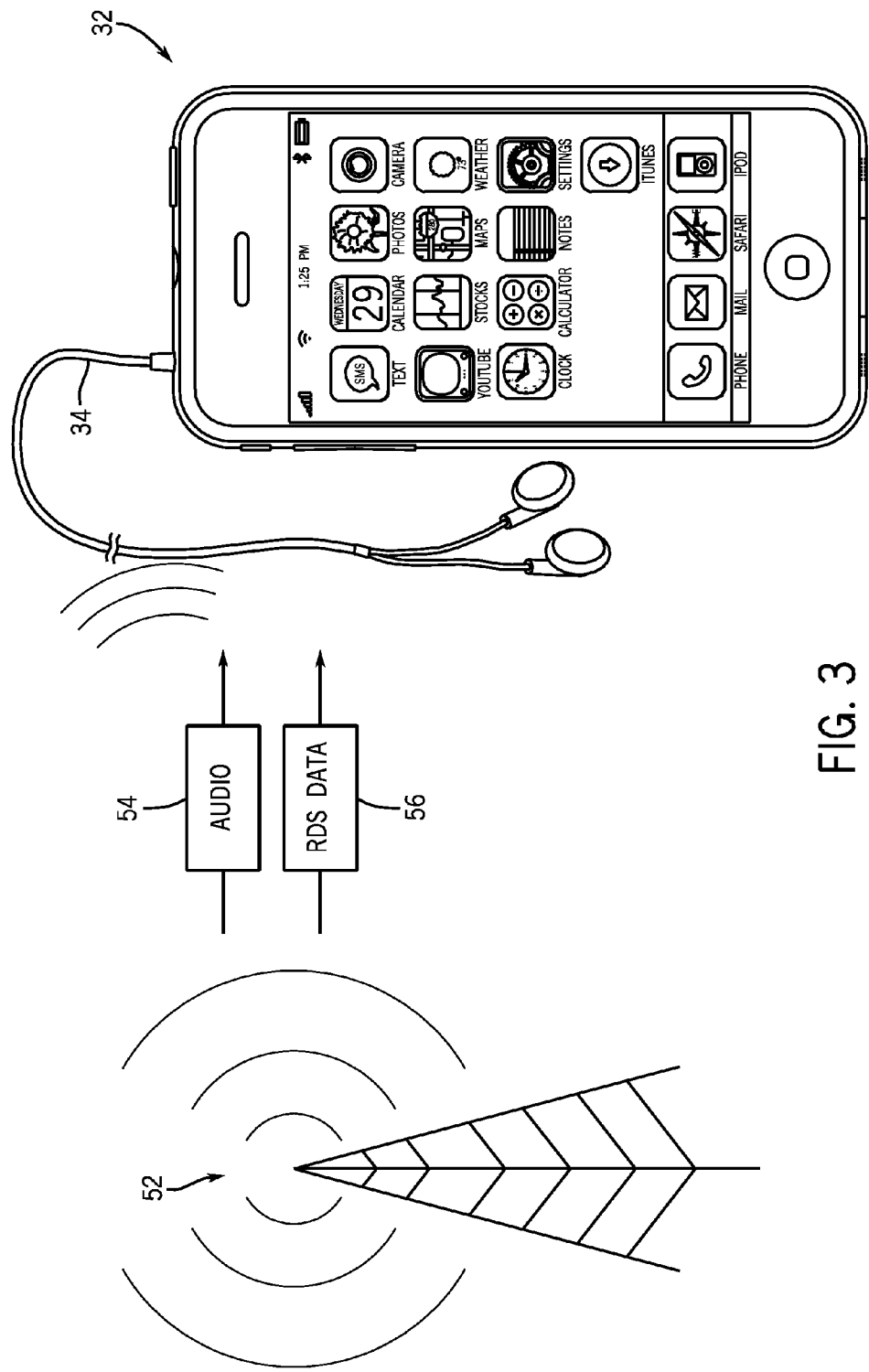
FIG. 3 is a schematic diagram of broadcast data that may be sent to the system of FIG. 2, in accordance with an embodiment.

FIG. 3 is a schematic diagram illustrating a radio broadcast signal that may be received by electronic device 10. As shown in FIG. 3, radio broadcaster 52 may broadcast a radio signal at a specific frequency that includes both audio data 54 and non-audio data, such as digital RDS data 56. By way of example, radio broadcaster 52 may be an FM radio broadcaster, audio data 54 may be an analog or digital FM radio signal, and digital RDS data 56 may include digital text data or other digital data relating to currently-playing audio in audio data 54. Such digital RDS data 56 may identify currently-playing audio in audio data 54 by listing an artist, a title, and/or a global unique identifier (GUID) for the currently-playing audio, among other things. The broadcast audio data 54 and RDS data 56 may be received by handheld device 32, or a similar electronic device 10, via antenna 34. As described below, the quality of audio data 54 and digital RDS data 56 may vary as a network profile of antenna 34 varies. Thus, from time to time, handheld device 32 may select from a number of selectable matching networks to improve reception.

Figure 4:
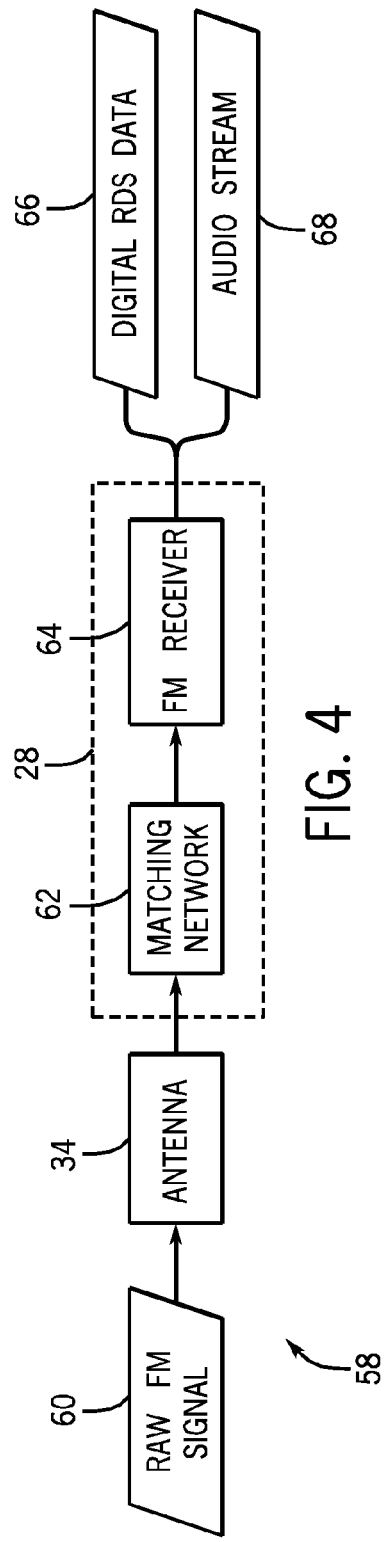
FIG. 4 is a flow diagram representing the reception of radio broadcast information, in accordance with an embodiment.

Flow diagram 58 of FIG. 4 schematically represents a manner of receiving such a broadcast radio signal having both audio data 54 and non-audio data, such as digital RDS data 56. Raw radio broadcast signal 60, which may include both audio data 54 and digital RDS data 56, may enter radio receiver 28 of handheld device 32 through antenna 34. Matching network 62 may be selected such that, when coupled to antenna 34, raw radio broadcast signal 60 is efficiently transferred to FM receiver 64 with sufficient signal quality. FM receiver 64 may process raw radio broadcast signal 60 to obtain digital RDS data 66 and audio stream 68. As such, FM receiver 64 may include analog-to-digital (A/D) circuitry for digitizing and/or compressing audio data 54 to obtain audio stream 68.

Digital RDS data 66 may include various textual information relevant to audio currently playing in audio stream 68. Specifically, digital RDS data 66 may supply blocks of digital data that identify, for example, radio broadcaster 52 call letters, an artist name, a song title, and/or a global unique identifier (GUID) associated with currently-playing audio, among other things. Certain signal characteristics of the received blocks of digital RDS data 66 may enable handheld device 32 to select matching network 62. Many such techniques are described below with reference to FIGS. 5-17.

Figure 5:
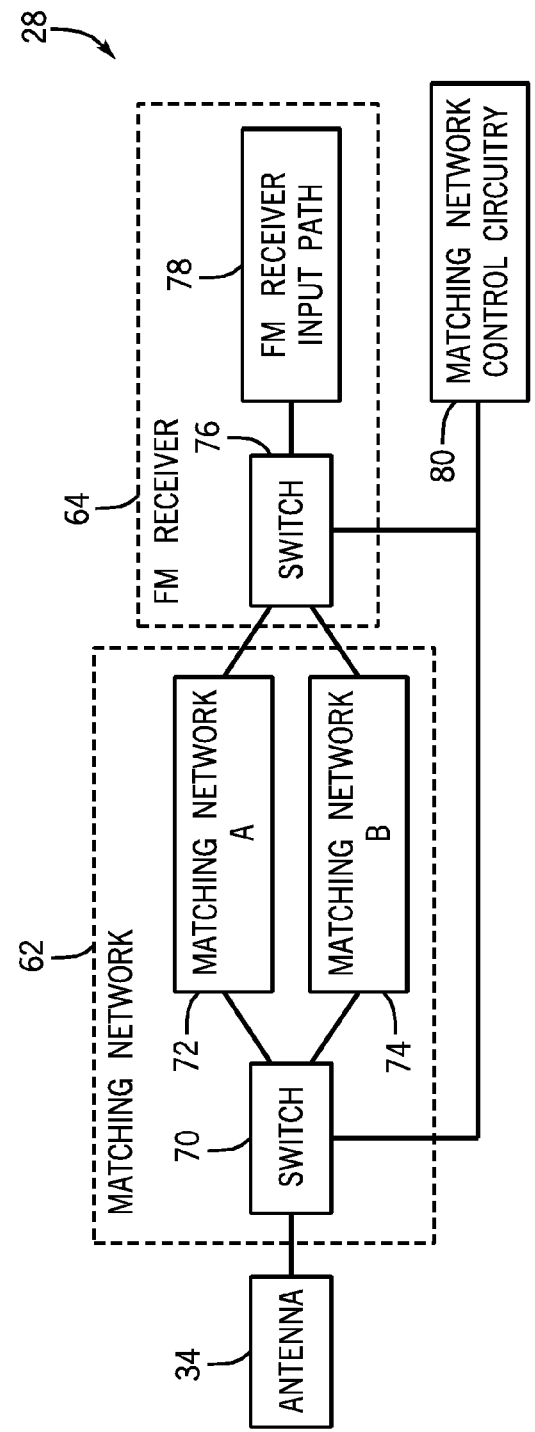
FIG. 5 is a schematic block diagram illustrating a radio receiver having multiple selectable matching networks, in accordance with an embodiment.

FIG. 5 schematically illustrates certain blocks of the flow diagram of FIG. 4. In particular, antenna 34 may couple to radio receiver 28, which may include matching network 62 coupled to FM receiver 64. Since antenna 34 may include flexible conductive wiring for a headset, as illustrated above with reference to FIG. 2, the impedance, or antenna network profile, of antenna 34 may vary as antenna 34 is shifted, bent, coiled, turned, and so forth. As the antenna network profile of antenna 34 changes, a signal quality of raw broadcast signal 60 may degrade if not properly matched to FM receiver 64. To effectively transfer raw broadcast signal 60 on antenna 34 through to FM receiver 64, matching network 62 may include two or more selectable matching networks, illustrated in FIG. 5 as matching network A and matching network B, that may best match the current profile of antenna 34. Although FIG. 5 illustrates two selectable matching networks employed by matching network 62, matching network 62 may employ any suitable number of matching networks.

To efficiently transfer raw broadcast signal 60 from antenna 34 to FM receiver 64, matching network 62 may include switch 70, which may selectively join antenna 34 to either matching networks 72 or 74, which are also labeled matching network A and matching network B. Similarly, FM receiver 64 may include switch 76, which may selectively join matching network A or matching network B to FM receiver input path 78. Alternatively, switch 76 may be a component independent of FM receiver 64. Matching network control circuitry 80 may control switches 70 and 76, causing the signal path to flow through matching network A or matching network B. Matching network control circuitry 80 may include logic for selecting either matching network A or matching network B based on various received radio signal characteristics. Additionally or alternatively, CPU 12 may control matching network control circuitry 80 to cause the selection of the matching network based on such signal characteristics.

The selectable matching networks of matching network 62, such as matching network A and matching network B, may be designed to accommodate various antenna network profiles of antenna 34 and/or various frequencies of radio signals. For example, matching network A may be designed for lower FM-band frequencies and matching network B may be designed for higher FM-band frequencies. Additionally or alternatively, matching network A and matching network B may be designed respectively for certain types of headsets generally sharing similar antenna network profiles, and/or matching network A and matching network B may be designed to match certain physical configurations of antenna 34, such as bending, wrapping, twisting, and so forth.

Matching network control circuitry 80 may select a suitable matching network from among those provided in matching network 62 based on the quality of a received radio signal. For example, matching network control circuitry 80 may select, or may be controlled by CPU 12 to select, either matching network A or matching network B based on certain signal characteristics of the received raw broadcast signal 60 or its components, audio signal 54 or digital RDS signal 56. Many such signal characteristics are described below with reference to FIG. 7.

Figure 6:
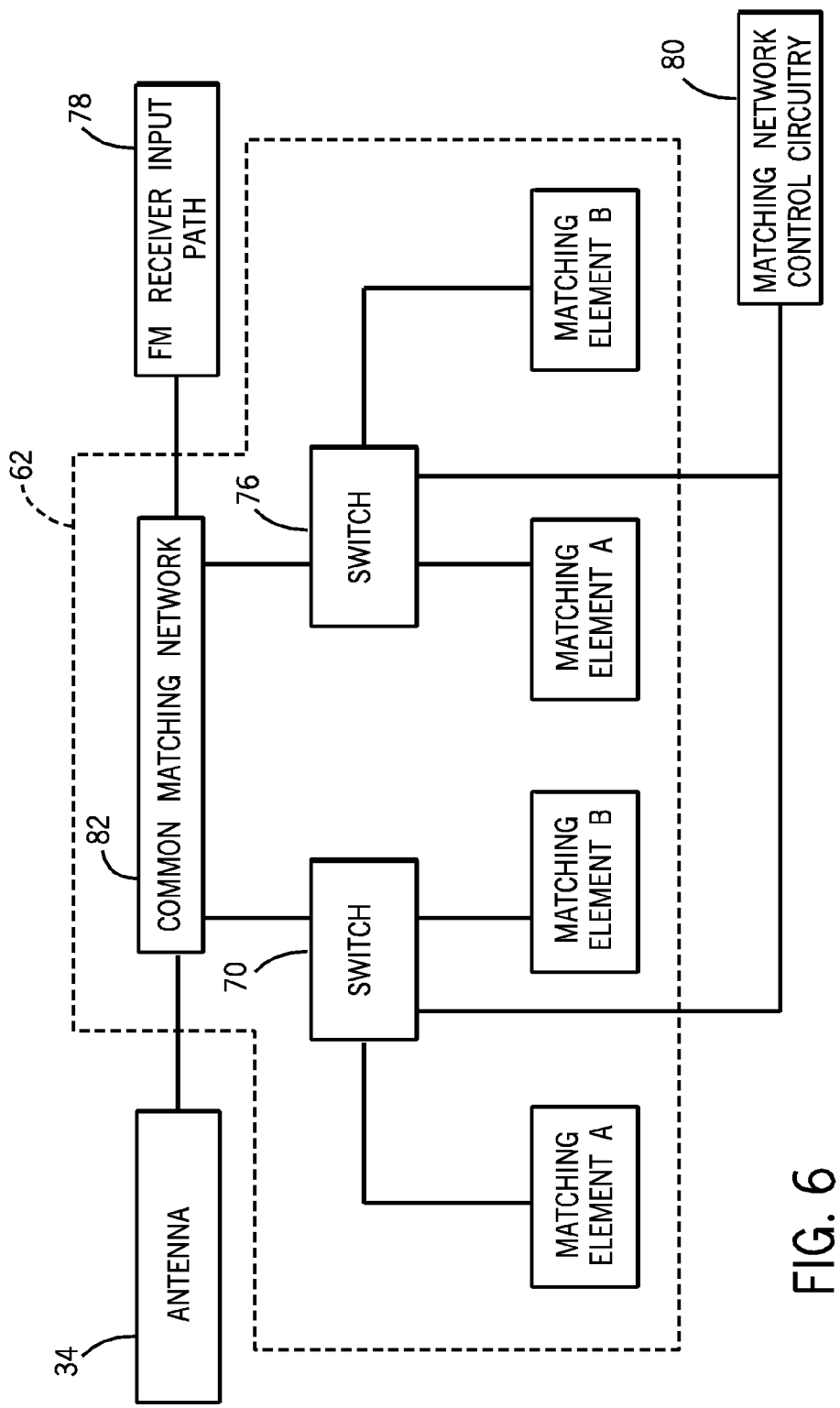
FIG. 6 is a schematic block diagram illustrating an alternative embodiment of the radio receiver having multiple selectable matching networks of FIG. 5.

FIG. 6 represents another embodiment of the matching network circuitry illustrated in FIG. 5. It should be appreciated that all techniques disclosed herein for selecting one of the matching networks A or B using the circuitry of FIG. 5 may similarly apply to the circuitry of FIG. 6. As illustrated in FIG. 6, antenna 34 may couple to matching network 62, which may couple to FM receiver input path 78. Matching network circuitry 62 may include common matching network 82, which may represent circuitry common to all selectable matching networks of matching network 62.

Matching network 62 may selectably function as one of several matching networks depending on which elements are switched into common matching network 82. In the embodiment illustrated in FIG. 6, matching network 62 may selectably function as either matching network A or matching network B, but may be adapted to selectably function as any suitable number of matching networks. To function as matching network A, switches 70 and 76 of matching network 62 may respectively couple to matching element A circuitry. Similarly, to function as matching network B, switches 70 and 76 of matching network 62 may respectively couple to matching element B circuitry. In this way, matching network A may be defined as the combination of common matching network 82 and matching element A circuitry, while matching network A may be defined as the combination of common matching network 82 and matching element A circuitry. By controlling switches 70 and 76 to select between matching elements A or B, matching network control circuitry 80 may respectively cause matching network 62 to function as matching network A or B.

Figure 7:
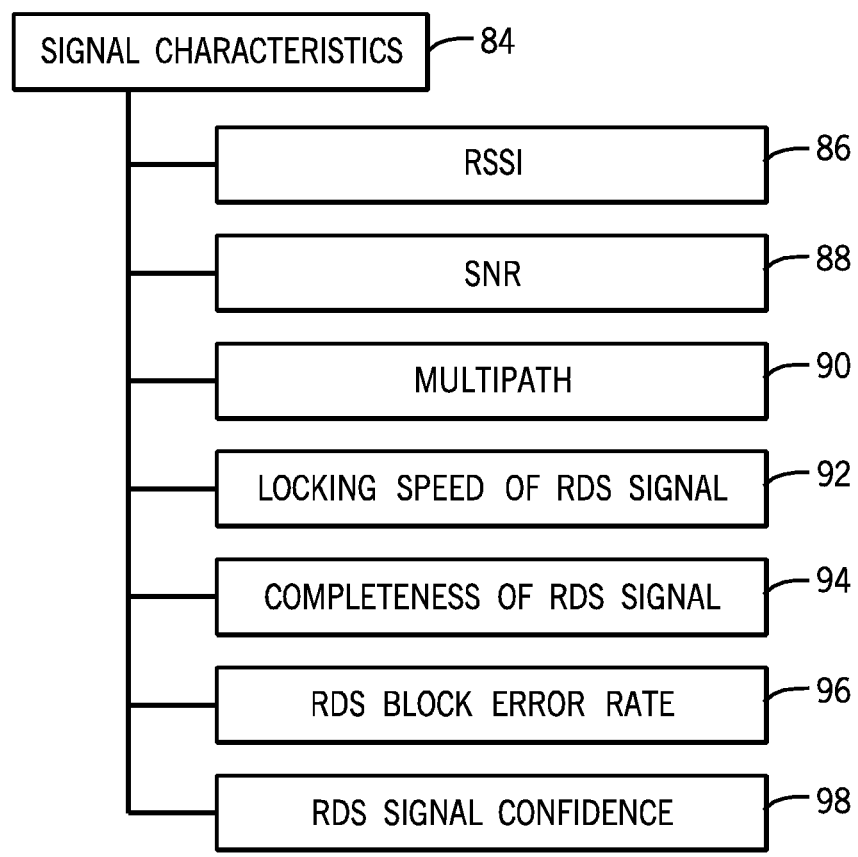
FIG. 7 is a schematic diagram representing various signal characteristics that may serve as a basis for selecting one of the matching networks of FIG. 5, in accordance with an embodiment.

FIG. 7 provides a diagram describing various signal characteristics 84 of the received raw broadcast signal 60 or its components. Based on such signal characteristics 84, electronic device 10 may determine which of the selectable matching networks in matching network 62 most efficiently transfers raw broadcast signal 60 from antenna 34 to FM receiver 64. Specifically, as noted above, the antenna network profile of antenna 34 may vary with movement and/or location, and improper impedance matching between antenna 34 and FM receiver 64 may cause raw broadcast signal 60 to degrade. As such, when the quality of raw broadcast signal 60 or its components falls beneath a threshold level, a currently-selected matching network of matching network 62 may not properly match the impedances of the antenna 34 and FM receiver 64. Thus, when the quality of raw broadcast signal 60 or its components falls beneath such a threshold level, matching network control circuitry 80 may select another selectable matching network of matching network 62.

CPU 12 or logic circuitry employed by matching network control circuitry 80 may determine the quality of raw broadcast signal 60 or its components by observing certain signal characteristics 84 associated with raw broadcast signal 60, such as received signal strength indicator (RSSI) 86, signal-to-noise ratio (SNR) 88, and/or a level of multipath distortion 90. Additionally or alternatively, signal characteristics 84 associated with digital RDS data 66 may be observed, which may include a locking speed 92, a completeness 94, a block error rate (BER) 96, and/or a signal confidence 98 of digital RDS data 66. Signal characteristics 84 may be assessed by radio receiver 28 when the raw broadcast signal 60 is processed to produce digital RDS data 66 and digital analog stream 68. Additionally or alternatively, CPU 12 or other specialized hardware may evaluate the produced digital RDS data 66 and digital analog stream 68 to estimate certain signal characteristics 84. It should be understood that the listed signal characteristics 84 described herein are intended to be exemplary and not exhaustive.

Received signal strength indicator (RSSI) 86 may provide an indication of how efficiently raw broadcast signal 60 has been transferred from antenna 34 to FM receiver 64 via matching network 62. While RSSI 86 remains above a threshold value, the currently-selected matching network A or B of matching network 62 may be proper, and the currently-selected matching network A or B may remain selected. Similarly, when RSSI 86 drops below a threshold value, the currently-selected matching network A or B of matching network 62 may be improper, and a different matching network of matching network 62 may be selected.

Signal-to-noise ratio (SNR) 88 may similarly indicate how efficiently raw broadcast signal 60 has been transferred from antenna 34 to FM receiver 64 via matching network 62 and, accordingly, whether the currently-selected matching network A or B of matching network 62 is proper. SNR 88 may vary depending on a level noise present in raw broadcast signal 60 after passing through matching network 62. Because FM receiver 64 may generally employ techniques for noise suppression, such as preemphasis and/or deemphasis, signal noise from raw broadcast signal 60 may not readily appear in digital RDS data 66 or audio stream 68 output by FM receiver 64. As such, FM receiver 64 may provide a determination of SNR 88 before noise suppression techniques have removed much of the noise originally present in raw broadcast signal 60. In certain embodiments, FM receiver 64 may additionally or alternatively provide a determination of SNR 88 after noise suppression techniques have been applied.

Multipath interference 90 characteristics, which may be caused by reflections and echoes of the raw broadcast signal 60 prior to reception by antenna 34, may also form a basis for selecting from among the selectable matching networks of matching network 62. Generally, FM receiver 64 may detect and/or compensate for certain levels of multipath interference 90. As such, FM receiver 64 may also provide such a detected level of multipath interference 90.

As noted above with reference to FIGS. 3 and 4, raw broadcast signal 60 may include both audio data 54 and a supplementary digital component such as digital audio data 56. FM receiver 64 may process raw broadcast signal 60 to obtain audio stream 68, based on audio data 54, and processed digital RDS data 66, based on digital RDS data 56. When processing digital RDS data 56 to obtain processed digital RDS data 66, FM receiver 64 may observe certain characteristics specifically associated with this digital component of raw broadcast signal 60.

In one example, when digital RDS data 56 is received and decoded by FM receiver 64, the quality of the digital RDS data 56 component of raw broadcast signal 60 may be reflected by the amount of time required for FM receiver 64 to lock onto digital RDS data 56 within raw broadcast signal 60. This digital RDS data 56 locking speed 92 may indicate signal quality because a higher-quality signal may result in a faster locking speed 92, while a lower-quality signal may result in a slower locking speed 92. Thus, if raw broadcast signal 60 has been efficiently transferred between antenna 34 and FM receiver 64 via the selected matching network A or B of matching network 62, locking speed 92 may be relatively fast. If not, locking speed 92 may be relatively slow.

In another example, as FM receiver 64 receives and decodes blocks of digital RDS data 56, various additional signal characteristics 84 may be determined. As described in the Radio Data System (RDS) specification, digital RDS data 56 from raw broadcast stream 60 may include defined blocks of data having predetermined lengths. Specifically, each block may include an information word of 16 bits and a checkword of 10 bits for a total of 26 bits. By applying error-checking techniques that compare the data received in the information word to the checkword, FM receiver 64 may determine a measure of the completeness 94 of the received digital RDS data 56, a measure of the general block error rate (BER) 96 of the received digital RDS data 56, and a measure of the signal confidence 98 of the received digital RDS data 56.

A relatively higher measure of completeness 94 or signal confidence 98, or a relatively lower measure of BER 96, may indicate a higher signal quality of raw broadcast signal 60. Similarly, a relatively lower measure of completeness 94 or signal confidence 98, or a relatively higher measure of BER 96, may indicate a lower signal quality of raw broadcast signal 60. Since the signal quality of raw broadcast signal 60 may vary depending on which of the selectable matching networks of matching network 62 is currently selected, selection of the proper selectable matching network may involve the consideration of completeness 94, BER 96, and/or signal confidence 98 of digital RDS data 56.

Any one or a combination of signal characteristics 84 representing the quality of raw broadcast signal 60, such as those described above, may be employed to select the proper selectable matching network of matching network 62 using a variety of techniques, many of which are described below. Matching network control circuitry 80 may select the proper matching network after CPU 12 or logic within matching network control circuitry 80 has evaluated one or more of the signal characteristics 84, which may be assigned digital values. These digital values, as well as various thresholds associated with the digital values for signal quality, may be used by CPU 12 or logic of matching network control circuitry 80 to select the appropriate selectable matching network from matching network 62.

By way of example, signal characteristics 84 may be evaluated in the following manner. Certain signal characteristics 84, such as RSSI 86, locking speed 92, and block error rate (BER) 96 may be individually evaluated and assigned a digital value (e.g., a number between 0 and 10). These digital values may be added together, or may be applied in a function weighting certain signal characteristics 84 differently according to how the certain signal characteristics 84 may relate to impedance matching. The resulting combination of digital values may be compared to a number representing a threshold level of signal quality. For example, if three signal characteristics 84 are each assigned a value from 0 to 10, and the values are simply summed for a maximum level of quality of 30, a threshold level of quality may be, for example, a digital value of 20. Any or all of signal characteristics 84 described above may be evaluated in such a manner when, as described below, the signal quality of raw broadcast signal 60 is tested to determine whether the proper selectable matching network of matching network 62 is selected. Alternatively, threshold values associated with certain signal characteristics 84 may relate to raw values, such as, for example, a specific maximum acceptable block error rate (BER) 96.

Figure 8:
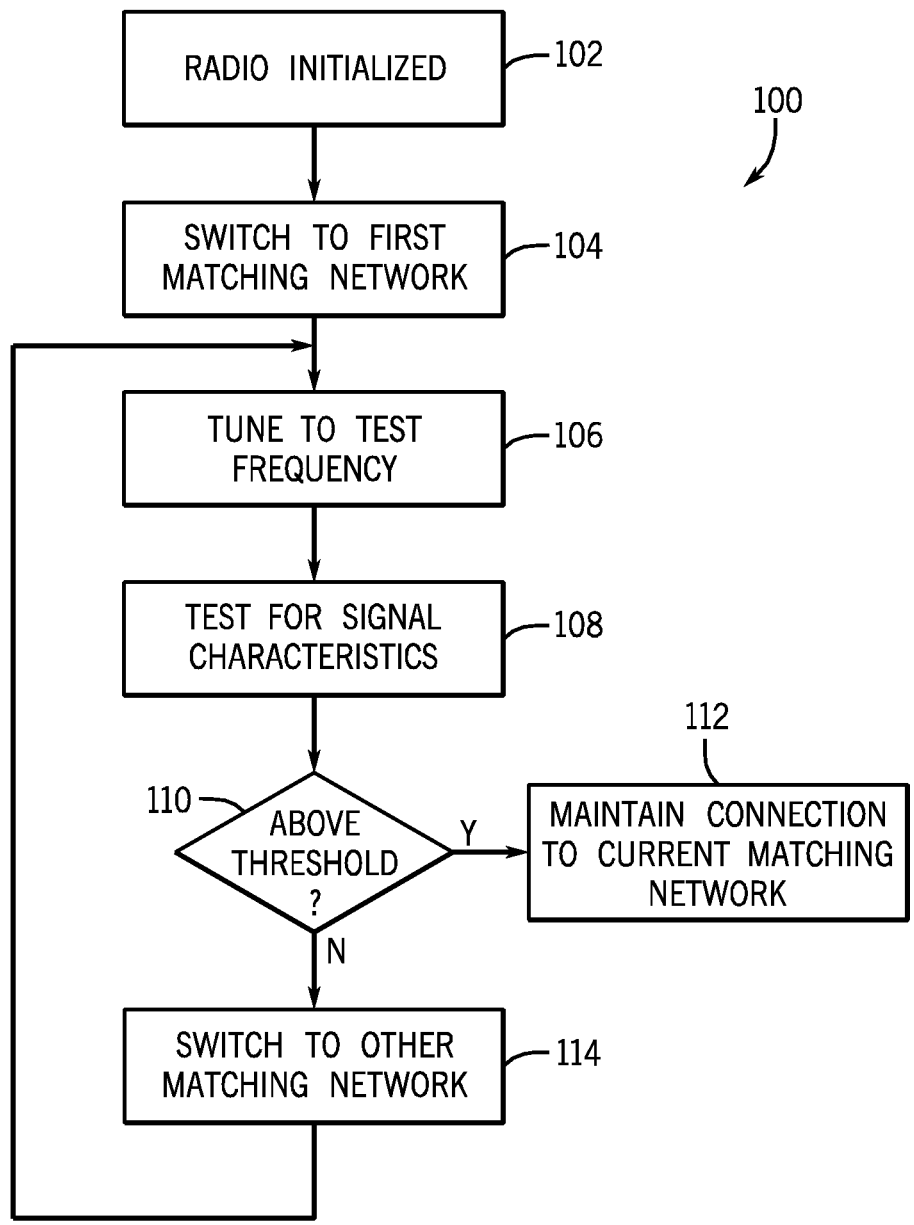
FIG. 8 is a flowchart describing an embodiment of a method for selecting one of the matching networks of FIG. 5.

One embodiment of a method for selecting between several selectable matching networks of matching network 62, such as selecting between matching network A and matching network B, is represented by flowchart 100 of FIG. 8. Generally, flowchart 100 may describe an embodiment of a method for selecting between matching network A and matching network B when radio receiver 28 is first initialized. In step 102, radio receiver 28 may be initialized, as may occur when electronic device 10 is powered on or when headset antenna 34 is inserted into electronic device 10.

In step 104, matching network control circuitry 80 may control switches 70 and 76 such that one of the two matching networks A or B is selected. Which of the matching networks A or B is selected as the first matching network to test in step 104 may be preset (e.g., always start with matching network A) or may be determined based on other factors (e.g., last requested radio frequency, headset global unique identifier (GUID), etc.), as described below with reference to FIGS. 10, 11, and 17. In step 106, FM receiver 64 may tune to a particular test frequency. The test frequency may be, for example, the frequency last requested by a user, an approximately median frequency of the radio frequency (RF) band that radio receiver 28 is able to receive, or one or more saved favorite radio frequencies.

In step 108, matching network control circuitry 80 may evaluate certain signal characteristics 84 of raw broadcast signal 60 at the test frequency. In the manner described above, CPU 12 or logic associated with matching network control circuitry 80 may assign discrete values to certain signal characteristics 84 associated with raw broadcast signal 60 received at the test frequency. For example, RSSI 86, locking speed 92, and block error rate (BER) 96 may be individually evaluated and assigned a digital value (e.g., a number between 0 and 10). The sum of the digital values may approximate a signal quality of raw broadcast signal 60.

In decision block 110, if the values associated with signal characteristics 84 of raw broadcast signal 60 exceed a threshold value (e.g., a value of 20 when three signal characteristics 84 are evaluated), the process may flow to step 112, and the connection to the currently-selected matching network A or B may be maintained. Alternatively, decision block 110 may involve determining whether a particular one or more signal characteristics 84 of interest remains above a threshold value. The threshold value compared in decision block 110 may be predetermined, or may vary depending on other factors, such as the current type of programming as indicated by digital RDS data 66. For example, the threshold associated with spoken word programming may be lower than the threshold associated with music programming. Additionally or alternatively, the threshold value may be relatively high when first tested in decision block 110, and may gradually drop as decision block 110 may repeat, as noted below, until an optimal matching network is selected from among the selectable matching networks of matching network 62.

If the signal characteristics 84 evaluated in step 108 fall below the threshold, as tested in decision block 110, the raw broadcast signal 60 may not be efficiently transferred between antenna 34 and FM receiver 64 because the impedance may not be properly matched. Thus, in step 114, matching network control circuitry 80 may switch to the next matching network. For example, if matching network control circuitry 80 had selected matching network A in step 104, matching network control circuitry 80 may select matching network B in step 114. Subsequently, steps 106, 108, 110, and 114 may continue indefinitely until the signal characteristics 84 improve and rise above the required threshold of decision block 110.

Figure 9:
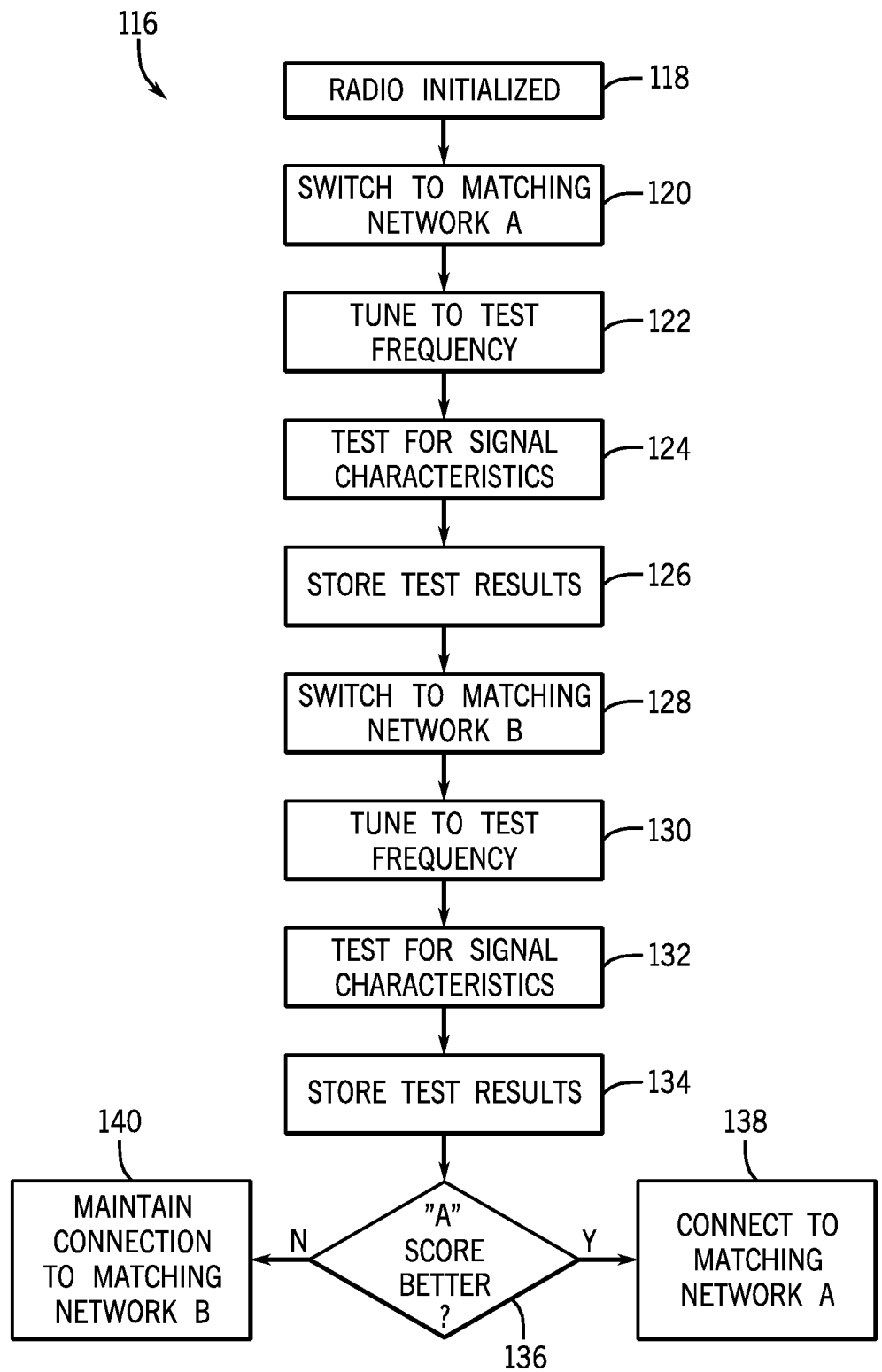
FIG. 9 is a flowchart describing an embodiment of another method for selecting the one of the matching networks of FIG. 5.

FIG. 9 depicts flowchart 116, providing another embodiment of a method for selecting the proper matching network upon initialization of radio receiver 28. In step 118, radio receiver 28 may be initialized, as may occur when electronic device 10 is powered on or when headset antenna 34 is inserted into electronic device 10. In step 120, matching network control circuitry 80 may select matching network A. In step 122, FM receiver 64 may tune to a test frequency. As noted above, the test frequency may be, for example, the frequency last requested by a user, an approximately median frequency of the radio frequency (RF) band that radio receiver 28 is able to receive, or one or more saved favorite radio frequencies.

In step 124, CPU 12 or logic associated with matching network control circuitry 80 may evaluate one or more signal characteristics 84 in the manner described above with reference to step 108 of flowchart 100. Subsequently, in step 126, the results of the evaluation of the one or more signal characteristics 84 of step 124 may be stored in memory 14. In step 128, matching network control circuitry 80 may select matching network B. In step 130, FM receiver 64 may remain tuned to the same test frequency as in step 122, and in step 132, the same signal characteristics 84 may be evaluated. The results of the evaluation of the signal characteristics 84 of step 132 also may be stored in memory 14 in step 134.

In decision block 136, the stored test results of steps 126 and 134 may be compared to determine which selectable matching network of matching network 62 should be selected. If the evaluation of step 126 is higher than the evaluation of step 134, the received raw broadcast signal 60 may be of a higher quality when matching network A is selected, and the process may flow to step 138. In step 138, matching network control circuitry 80 may select matching network A. If the evaluation of step 126 is lower than the evaluation of step 134, the received raw broadcast signal 60 may be of a higher quality when matching network B is selected, and the process may flow to step 140. In step 140, matching network control circuitry 80 may continue to select matching network B.

As described above with reference to flowchart 100 of FIG. 8, when radio receiver 28 is initialized, matching network control circuitry 80 may initially connect to a first matching network to begin testing. Flowchart 142 of FIG. 10 describes one embodiment of a method for selecting such a first matching network from among the selectable matching networks of matching network 62. The use of the method of flowchart 142 to select the first matching network may increase the likelihood that the first selected matching network properly matches antenna 34 to FM receiver 64.

Figure 10:
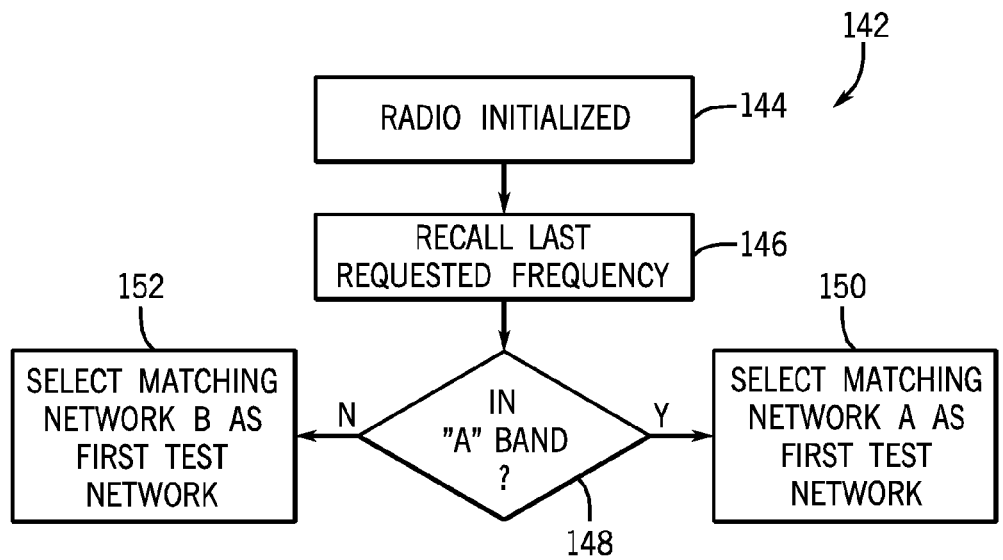
FIG. 10 is a flowchart describing an embodiment of a method for selecting an initial matching network from among the matching networks of FIG. 5.

Flowchart 142 of FIG. 10 may begin when electronic device 10 is powered on or when headset antenna 34 is inserted into electronic device 10 in step 144, which may cause radio receiver 28 to initialize. In step 146, a radio frequency expected to be requested by a user of electronic device 10 may be recalled from memory 14 or nonvolatile storage 16. Such an expected radio frequency may include, for example, the most recently requested radio frequency, most commonly requested radio frequency, or a radio frequency often used during current circumstances. For example, if a user last requested a particular radio frequency when the user was at a particular location (e.g., a local area FM broadcast at a fitness facility), and location-sensing circuitry 22 indicates that electronic device 10 is at that particular location, electronic device 10 may recall the particular recalled radio frequency from memory 14 or nonvolatile storage 16.

As noted above, the selectable matching networks of matching network 62, such as matching network A and matching network B, may be designed to best match antenna 34 and FM receiver 64 in different circumstances. In some embodiments, matching network A and matching network B may be designed for particular bands of frequency spectrum. If, in decision block 148, matching network A is generally designed for a frequency band that includes the frequency recalled in step 146, matching network control circuitry 80 may select matching network A as the first network to test, in step 150. On the other hand, if matching network B is generally designed for a frequency band that includes the frequency recalled in step 146, matching network control circuitry 80 may instead select matching network B as the first network to test, in step 152.

Figure 11:
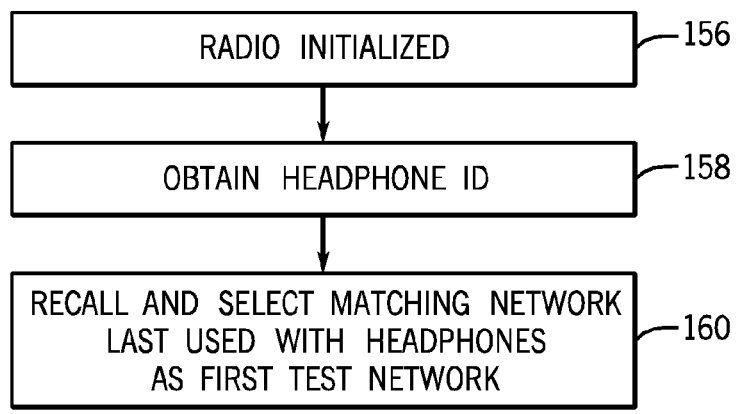
FIG. 11 is a flowchart describing an embodiment of another method for selecting the initial matching network from among the matching networks of FIG. 5.

Flowchart 154 of FIG. 11 describes another embodiment of a method for selecting a first matching network to test from among the selectable matching networks of matching network 62, as described above with reference to flowchart 100 of FIG. 8. After radio receiver 28 is initialized in step 156, which may occur when electronic device 10 is powered on or when headset antenna 34 is inserted into electronic device 10, CPU 12 or logic associated with matching network control circuitry 80 may obtain a global unique identifier (GUID) associated with headset antenna 34 from a signal provided by headset antenna 34 in step 158. Because a user of electronic device 10 may frequently use a particular headset in the same context (e.g., at a fitness facility, walking through the city, while sitting at a desk, etc.), the antenna network profile of headset antenna 34 may be similar under such circumstances.

To properly match the antenna network profile of headset antenna 34 to FM receiver 64, the proper selectable matching network of matching network 62 also may be similar. Thus, the GUID obtained in step 158 may be used to estimate a proper matching network when the user initializes electronic device 10 with the headset. In step 160, based on the obtained GUID, CPU 12 or logic associated with matching network control circuitry 80 may recall which of the selectable matching networks of matching network 62 was last used with the current headset antenna 34. Matching network control circuitry 80 may select this recalled matching network to be the first test matching network.

Figure 12:
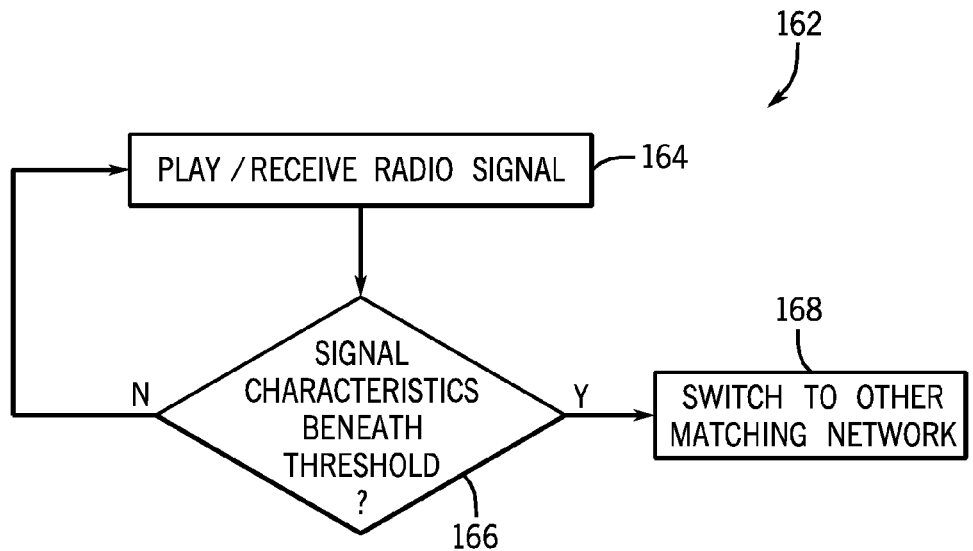
FIG. 12-14 are flowcharts describing embodiments of methods for evaluating the proper matching network after a radio signal is being received.

FIGS. 12-15 provide flowcharts describing embodiments of methods for reevaluating the proper selectable matching network after raw broadcast signal 60 is being received and/or played. Turning first to FIG. 12, flowchart 162 describes an embodiment of a method for continually evaluating signal characteristics 84 associated with the received raw broadcast signal 60. In step 164, electronic device 10 may receive and/or play raw broadcast signal 60 in the manner described above with reference to FIG. 4. In decision block 166, electronic device 10 may evaluate and test certain signal characteristics 84 continually. If these certain signal characteristics 84 drop beneath a threshold, matching network control circuitry 80 may switch to a different matching network in an attempt to improve the signal characteristics 84, in step 168. The certain signal characteristics 84 that are continually tested in decision block 166 may relate to digital RDS data 56 received by FM receiver 64. As digital RDS data 56 are received and processed by FM receiver 64, FM receiver may continually provide signal characteristics 84 specifically associated with digital RDS data 56.

Figure 13:
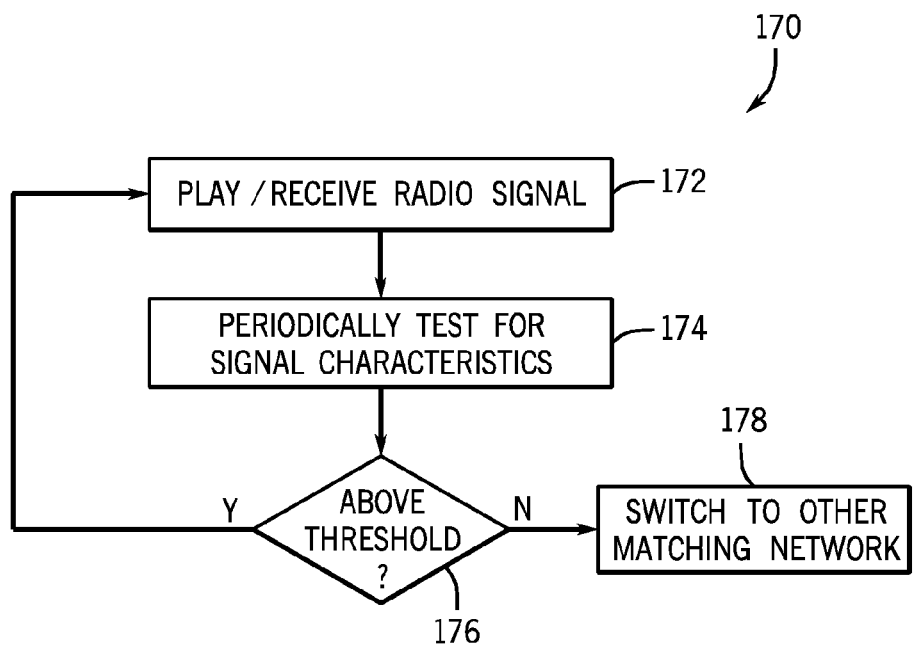

Flowchart 170 of FIG. 13 describes an embodiment of a method for periodically, rather than continually, evaluating signal characteristics 84 associated with the currently-selected matching network of matching network 62. In step 172, electronic device 10 may be receiving and/or playing raw broadcast signal 60. In step 174, matching network control circuitry 80 may periodically evaluate signal characteristics 84. For example, matching network control circuitry 80 may test or may evaluate certain signal characteristics 84 every second, 5 seconds, 10 seconds, 30 seconds, minute, 2 minutes, 5 minutes, and so forth. If, in decision block 176, signal characteristics 84 fall below a given threshold, in step 178, matching network control circuitry 80 may switch to another matching network. The method of flowchart 170 may be particularly useful for evaluating analog signal characteristics 84 of raw broadcast signal 60, such as received signal strength indicator (RSSI), signal-to-noise ratio (SNR) 88, and/or multipath characteristics 90.

Figure 14:
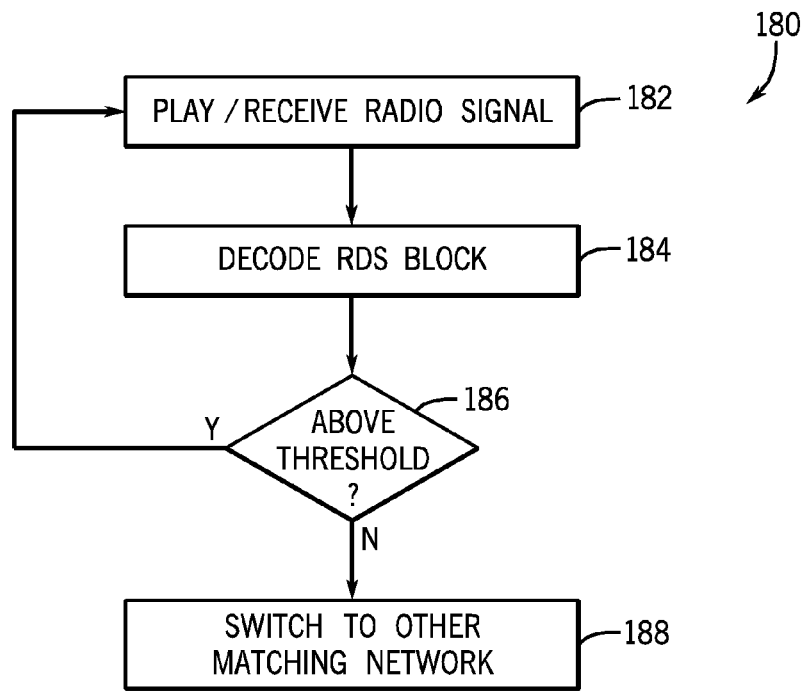

Flowchart 180 of FIG. 14 describes another embodiment of a method for evaluating the currently-selected matching network of matching network 62. In step 182, electronic device 10 may be receiving and/or playing the raw broadcast signal 60, and in step 184, FM receiver 64 may decode a series of blocks of digital RDS data 56. As each block of digital RDS data 56 is processed, completeness 94, block error rate (BER) 96, or signal confidence 98 may be determined and provided. In decision block 186, after each RDS block is decoded, signal characteristics associated with the recently-decoded block may be evaluated. If these signal characteristics 84 fall beneath a threshold, matching network control circuitry 80 may select another matching network in step 188.

Figure 15:
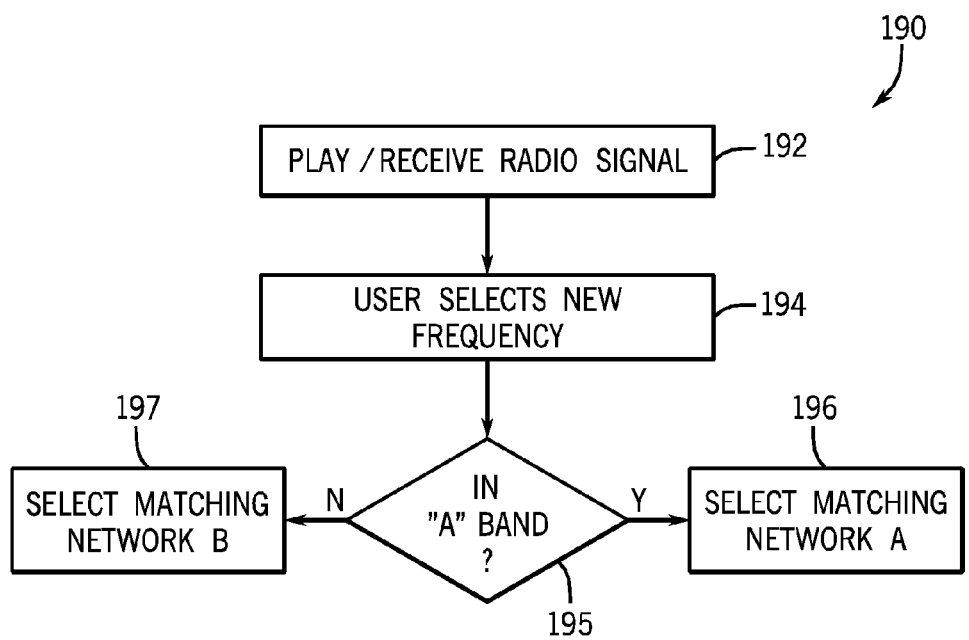
FIG. 15 is a flowchart describing an embodiment of a method for selecting a matching network when a user selects a new frequency.

Flowchart 190 of FIG. 15 describes an embodiment of a method for selecting a matching network when a user selects a new frequency. In step 192, electronic device 10 may receive and/or play information from raw broadcast signal 60, and in step 194, a user may tune to a new radio frequency. In doing so, the currently-selected matching network of matching network 62 may not be optimal for the new frequency.

Because the selectable matching networks of matching network 62, such as matching network A and matching network B, may be designed to best match antenna 34 and FM receiver 64 for particular bands of frequency spectrum, decision block 195 may test whether one of the selectable matching networks of matching network 62 is best suited for the requested frequency. If, in decision block 195, matching network A is generally designed for a frequency band that includes the frequency requested in step 194, matching network control circuitry 80 may select matching network A in step 150. On the other hand, if matching network B is generally designed for a frequency band that includes the frequency requested in step 194, matching network control circuitry 80 may instead select matching network B in step 197.

Figure 16:
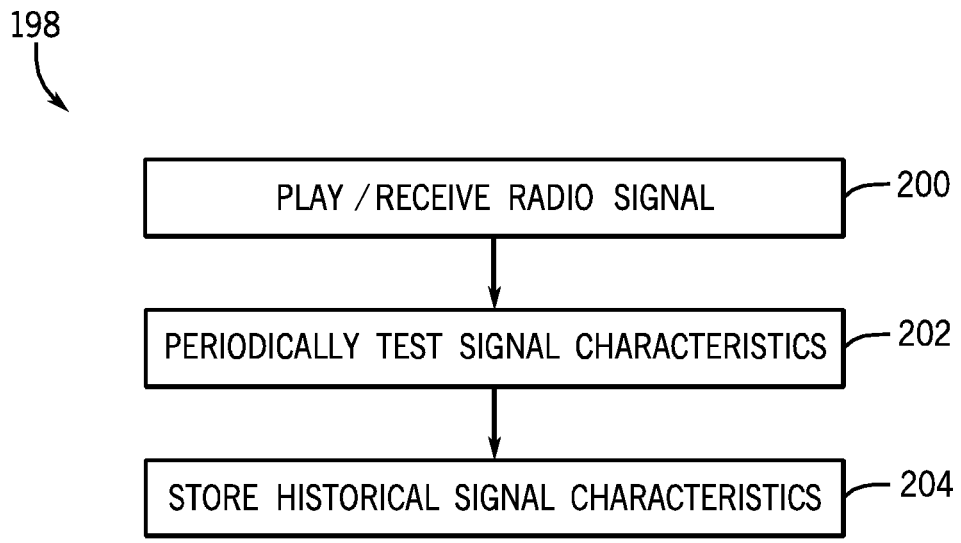
FIG. 16 is a flowchart describing an embodiment of a method for maintaining a historical record of device characteristics.
Figure 17:
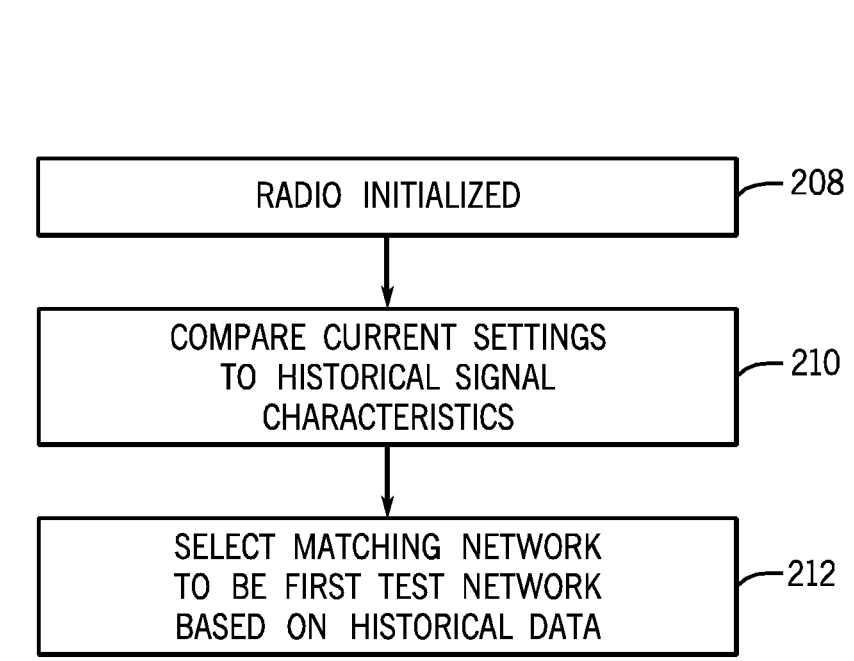
FIG. 17 is a flowchart describing an embodiment of a method for selecting one of the matching networks of FIG. 5 based on a historical record of device characteristics.

FIGS. 16-17 represent manners of employing historical signal characteristics 84 and various other data to determine the proper selectable matching network of matching network 62. Turning first to FIG. 16, flowchart 198 describes an embodiment of a method for maintaining historical signal characteristic 84 data and historical matching network data. In first step 200, electronic device 10 may be receiving and/or playing information received from raw radio broadcast 60. In step 202, various signal characteristics 84 may be evaluated periodically, in the manner described above with reference to FIG. 7. In step 204, the current evaluations of signal characteristics 84 may be recorded and stored in non-violate storage 16. In addition to those signal characteristics 84 evaluated in step 202, other information, such as the currently applied matching network A or B, a GUID associated with the current headset antenna 34, an orientation or location of electronic device 10 as determined from location-sensing circuitry 22 or accelerometers 30, and/or a current radio frequency of raw broadcast signal 60.

Storing the periodically-tested signal characteristics 84, currently-selected matching network of matching network 62, and various other data relating to the context in which electronic device 10 is being used may enable the later determination of meaningful associations between raw broadcast signal 60 quality and the proper matching network. For example, electronic device 10 may be used in a particular location and orientation (e.g., on a user's arm at a fitness facility), which may affect how raw broadcast signal 60 is received (e.g., through building walls and at a particular distance from broadcast station 52) and which may also affect the antenna network profile of headset antenna 34 (e.g., as the flexible wiring of antenna 34 is wrapped, bent, twisted, etc.). A particular matching network A or B of matching network 62 may be employed to match antenna 34 to FM receiver 64 under such conditions. Thereafter, signal characteristics 84, contextual data, and the selected matching network may be stored in memory 14 or nonvolatile storage 16.

Flowchart 206 of FIG. 17 describes an embodiment of a method for selecting a first test matching network based on such stored historical signal characteristics 84 and other contextual data. In step 208, radio receiver 28 may be initialized, which may occur when electronic device 10 is powered on or antenna 34 is inserted into electronic device 10. In step 210, the current electronic device 10 context of use may be compared to the historical signal characteristics 84 and other contextual data stored in step 204. In step 212, the first matching network to be tested may be selected based on the comparison of step 210.

The embodiment of the method of flowchart 206 may be exemplified using the example introduced above. When a user begins to use electronic device 10, the current context of use may be considered. If the current context of use resembles a prior context of use (e.g., on the user's arm at a fitness facility), and the signal characteristics 84 of that prior context of use were acceptable, the selectable matching network of matching network 62 that was employed in the prior context may be selected for the current context.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method comprising:
   receiving a radio broadcast signal from an antenna into a radio receiver via one of a plurality of selectable matching networks, the antenna comprising a flexible conductor, a network profile of the antenna varying when the flexible conductor is physically reconfigured;
   decoding an analog audio signal and a digital signal from the radio broadcast signal using the radio receiver;
   evaluating a signal quality of the digital signal and a signal quality of the analog audio signal or of the radio broadcast signal using the radio receiver; and
   selecting another one of the plurality of selectable matching networks when the signal quality of the digital signal, the signal quality of the analog audio signal, or the signal quality of the radio broadcast signal falls beneath a threshold using matching network control circuitry;
   wherein the signal quality of the digital signal is evaluated based at least in part by applying a discrete value to a signal characteristic of the digital signal, and wherein the other one of the plurality of selectable matching networks is selected when the discrete value falls beneath the threshold.

2. The method of claim 1, wherein the signal quality of the digital signal is evaluated based at least in part on a locking speed of the digital signal; a completeness of the digital signal; a block error rate of the digital signal; or a confidence of the digital signal; or any combination thereof.

3. The method of claim 1, wherein the other one of the plurality of selectable matching networks is selected when the signal quality of the digital signal falls beneath the threshold, wherein the threshold is lower when the digital signal indicates that the analog audio signal comprises spoken audio than when the digital signal indicates that the analog audio signal comprises music.

4. An electronic device comprising:
   a headphone jack configured to connect to a wired headset;
   a radio receiver configured to decode an audio signal and a non-audio signal from a broadcast radio signal;
   matching network circuitry electrically disposed between the headphone jack and the radio receiver and configured to selectably function as one of a plurality of matching networks between the wired headset and the radio receiver, such that the radio receiver is capable of receiving the broadcast radio signal when the wired headset is connected to the headphone jack, a network profile of the wired headset varying when a flexible conductor in the wired headset is physically reconfigured;
   matching network control circuitry configured to supply a control signal to the matching network circuitry to cause the matching network circuitry to function as the one of the plurality of matching networks; and
   data processing circuitry configured to control the matching network control circuitry based at least in part on a quality of the non-audio signal and the audio signal, wherein the quality of the audio signal is determined by evaluating a received signal strength indicator of the broadcast radio signal; a signal-to-noise ratio of the broadcast radio signal; or the presence of multipath characteristics in the broadcast radio signal; or any combination thereof;
   wherein the matching network control circuitry comprises common matching network circuitry coupled to one or more switches, wherein the one or more switches are coupled to a plurality of matching network elements, wherein the matching network control circuitry is configured to function as the one of the plurality of matching networks when a corresponding one of the plurality of matching network elements is coupled to the common matching network circuitry, and wherein the control signal is configured to cause the one or more switches to couple the one of the plurality of matching network elements to the common matching network circuitry.

5. The electronic device of claim 4, wherein the plurality of matching networks comprises a first matching network configured to transmit the broadcast radio signal when the broadcast radio signal is in a first radio frequency band and a second matching network configured to transmit the broadcast radio signal when the broadcast radio signal is in a second radio frequency band.

6. The electronic device of claim 4, wherein the matching network circuitry comprises a first switch configured to electrically couple the headphone jack to one of the plurality of matching networks and a second switch configured to electrically couple the one of the plurality of matching networks to the radio receiver, wherein the control signal is configured to cause the first switch and the second switch to connect to the one of the plurality of matching networks.

7. A method comprising:
receiving a broadcast radio signal from an antenna into a radio receiver via one of a plurality of selectable matching networks, the antenna comprising a flexible conductor, an antenna network profile of the antenna varying when the flexible conductor is physically reconfigured;
decoding an analog audio signal and a digital signal from the radio broadcast signal using the radio receiver;
selecting the one of the plurality of selectable matching networks from among the plurality of selectable matching networks based at least in part on a quality of the digital signal using matching network control circuitry;
storing data relating to a context of use and the one of the plurality of selectable matching networks into volatile or nonvolatile memory, wherein the data comprises data relating to a frequency of the broadcast radio signal; a location determined by location-sensing circuitry; an orientation determined by one or more accelerometers; or a global unique identifier associated with the antenna; or any combination thereof; and
initializing the radio receiver after the data relating to the context of use the one of the plurality of selectable matching networks has been stored, evaluating a new context of use, and selecting the one of the plurality of selectable matching networks or another of the plurality of selectable matching networks using the matching network control circuitry based at least in part on a comparison between the new context of use and the stored context of use.

8. The method of claim 7, comprising storing data relating to the quality of the digital signal when data relating to the context of use and the one of the plurality of selectable matching networks are stored.

* * * * *